United States Patent
Ishigami et al.

(10) Patent No.: US 6,634,010 B2
(45) Date of Patent: Oct. 14, 2003

(54) ASIC DESIGN SUPPORT SYSTEM

(75) Inventors: Hisashi Ishigami, Yokosuka (JP); Takao Aoyagi, Kawasaki (JP); Hideki Taguchi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 10 days.

(21) Appl. No.: 09/886,985

(22) Filed: Jun. 25, 2001

(65) Prior Publication Data

US 2001/0056446 A1 Dec. 27, 2001

(30) Foreign Application Priority Data

Jun. 26, 2000 (JP) ........................................ 2000-190811

(51) Int. Cl.[7] .............................................. G06F 17/50
(52) U.S. Cl. ........................ 716/1; 716/1; 716/3; 716/6; 716/7; 716/11; 716/16; 716/18; 700/100; 703/14; 703/17; 703/19; 707/10; 707/101; 707/202; 707/513
(58) Field of Search ............................... 716/3, 6, 7, 11, 716/16, 18, 1; 709/249, 217; 707/202, 513, 101, 10; 703/2, 14, 17, 19, 1; 700/100; 370/392; 326/38

(56) References Cited

U.S. PATENT DOCUMENTS

| | | | |
|---|---|---|---|
| 5,557,774 A | * | 9/1996 | Shimabukuro et al. ........ 703/21 |
| 5,703,788 A | | 12/1997 | Shei et al. |
| 5,950,201 A | * | 9/1999 | Van Huben et al. .......... 707/10 |
| 5,974,454 A | | 10/1999 | Apfel et al. |
| 2001/0044667 A1 | * | 11/2001 | Nakano et al. .............. 700/100 |

FOREIGN PATENT DOCUMENTS

| | | |
|---|---|---|
| JP | 10-091407 | 4/1998 |
| JP | 10-222374 | 8/1998 |

* cited by examiner

Primary Examiner—Vuthe Siek
Assistant Examiner—Yelena Rossoshek
(74) Attorney, Agent, or Firm—Finnegan, Henderson, Farabow, Garrett & Dunner, L.L.P.

(57) ABSTRACT

An improved ASIC design support system is described. In accordance with the ASIC design support system, it is possible to easily download the latest versions of a necessary library (or libraries) and a necessary simulator. The ASIC design support system includes a web server which receives a request of the customer including the specification of the ASIC he wants to design. The web server serves to generate and transfer to the customer a library (or libraries) or a simulator required for designing said ASIC and performing simulation thereof.

1 Claim, 5 Drawing Sheets

FIG.2

REGISTRATION
New Customer's Product

Customer Information

| ID | ID1234 |
| --- | --- |
| Entity Name | ASIC.Ltd |
| Division | LSI DEVELOPMENT |
| Person in Charge | Taro Kaja |
| Mail Address | taro.toshiba@xxxxxx |

Specification

| Nickname | DYNABOOK |
| --- | --- |
| Application | Personal Computer |
| Product Name | TC200C11AF-XXXX |
| Technology | TC200C |
| Voltage(V) | 3.3 |
| Maximum Freq.(MHz) | 55 |
| Internal Avg. Freq. (MHz) | 33 |
| Logic Scale(Kgate) | 300 |
| Ambient Temperature (°C) | -20/85 |
| Package Name | QFP144 |

FIG.4

```
! /bin/csh - f foreach PAT ("FC1" "FC2" "FC3" "FC4" "DC1" "DC2")
    tsc  testext = $PAT  setx = x  setz = x  init = x
  end foreach PAT ("FC1" "FC2" "FC3" "FC4" "DC1" "DC2")
  #MAX
  vepresra DEMO. ver DEMO. drive. $PAT testext = $PAT + maxdelays
  sra testext = $PAT
  #MIN
  vepresra DEMO. ver DEMO. drive. $PAT testext = $PAT + mindelays
  sra testext = $PAT
  #TYP
  vepresra DEMO. ver DEMO. drive. $PAT testext = $PAT + typdelays
  sra testext = $PAT
end
```

FIG.5

```
*COMMON
  module      = DEMO
  design      = DEMO
  technology  = TC200G
  voltage     = 3.3
  simulator   = VERILOG
  kfactor     = 1.00
```

ASIC DESIGN SUPPORT SYSTEM

CROSS REFERENCE TO RELATED APPLICATIONS

This application claims benefit of priority under 35 USC §119 to Japanese Patent Application No.2000-190811, filed on Jun. 26, 2000, the entire contents of which are incorporated by reference herein.

BACKGROUND OF THE INVENTION

1. Field of the Invention

The present invention is related to an ASIC design support system for supporting ASIC designing works.

2. Prior Art

It is a critical requirement for enlarging share and securing an enough profit to reduce the time to market. In recent years, taking into consideration a short useful lifespan, a LSI, particularly, an ASIC must be developed quickly as compared with the past cases. On the other hand, the scales and the complexity of LSIs have been increased so that the support by the LSI vender is inevitable to design a useful ASIC in a short period of time.

In accordance with a conventional technique, a customer initiates ASIC development with a specification of the circuit as a target. Namely, the customer has to prepare a specification which includes what functions and characteristics the ASIC should has, what performance (e.g, the maximum operating frequency) is required, to what application the ASIC is used, what signals the ASIC should output, and so forth.

The customer then makes contact with the LSI vender to estimate for the price of the LSI. It is then judged whether or not an order should be placed, and if placed the customer is provided with a necessary library (or libraries) and a necessary simulator. More specifically speaking, the necessary library (or libraries), the necessary simulator and the like are sent by mail or downloaded from the homepage of the LSI vender, and installed in the environment of the customer. Also, the customer obtains a printed or electric manual(s) containing information about the method of manipulating the simulator, the cells and the design technology of the simulator.

The customer then conducts the logic design of the system with an HDL (Hardware Description Language) and so forth. The source text as designed is used to perform the logic synthesis in order to verify the design by simulation. In the case where the result of the simulation is not satisfactory, the verification of the design of the logic circuit is repeated by repeating the designing procedure and the logic synthesis.

The simulation can be conducted in general by preparing and executing a batch file and a configuration file in which are described simulation commands, the execution condition, selected options and so forth depending upon the version of the library (or libraries) and the distributing LSI vender.

However, it is required to describe the batch file and the configuration file, i.e., simulation commands, the execution condition, selected options and so forth depending upon the version of the library (or libraries) and the distributing LSI vender in order that the description can be parsed and interpreted by the simulator and the operating system (OS) serving to start the simulator. For this reason, the ASIC customer must have enough knowledge about the functions of the simulator and the operating system so that he has to learn them in advance of starting actual work, resulting in a substantial time and costs required for the learning. In addition to this, the batch file and the configuration file have to be rewritten, each time when the simulation condition is modified, so as to increase the time required for completing the preparation of the batch file and the configuration file and to increase the chance of making mistakes when preparing the batch file and the configuration file.

On the other hand, the library (or libraries) and the simulator are frequently updated at any time by the LSI vender when bugs have been fixed and/or when new functions have been introduced. When updated, the ASIC customer has to replace the current library (or libraries) and the current simulator by latest ones. However, while update information is given by the LSI vender for example through an e-mail from the LSI vender and the like or through the homepage, it is difficult for the ASIC customer to timely update these files.

SUMMARY OF THE INVENTION

In brief, the above and other objects and advantages of the present invention are provided by a new and improved ASIC design support system comprising: a web server; a homepage stored in the web server and transmitted to a customer through the Internet.

the homepage containing a form through which the customer can transmit to the web server the specification of an ASIC which the customer wants to purchase; a file generation mechanism associated with the web server for receiving the specification of the ASIC and generating a batch file and a configuration file which are required for designing the ASIC and performing simulation thereof, a mechanism for transferring the batch file and the configuration file required for designing the ASIC and performing simulation thereof; an update judgment mechanism for judging whether or not a library and/or a simulator required for designing the ASIC and performing simulation thereof was updated after the customer obtained a batch file and a configuration file at the last time with reference to update information of the library and the simulator and historic information of preparing batch files and configuration files; and a mechanism for transferring the latest versions of the library and/or the simulator required for designing the ASIC and performing simulation thereof when the update judgment mechanism judges that the library and/or the simulator required for designing the ASIC and performing simulation thereof was updated after the customer obtained a batch file and a configuration file at the last time.

In a preferred embodiment, further improvement resides in that an e-mail is send to the customer with information of a storage location (URL) in which are stored the batch file and the configuration file as generated by the file generation mechanism so that the customer can access to the storage location in order to download the batch file and the configuration file as generated.

In a preferred embodiment, further improvement resides in that the batch file and the configuration file as generated by the file generation mechanism are transferred to the customer as attachment file to an e-mail.

In a preferred embodiment, further improvement resides in that the batch file and the configuration file as generated by the file generation mechanism are downloaded directly from the homepage.

In a preferred embodiment, further improvement resides in that, in the case where the library and/or the simulator required for designing the ASIC and performing simulation thereof was updated after the customer obtained a batch file and a configuration file at the last time, the e-mail contains information of a storage location (URL) in which the library and/or the simulator are stored so that the customer can access to the storage location in order to directly download the library and/or the simulator.

BRIEF DESCRIPTION OF DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 2 is a schematic diagram showing an exemplary page including a form through which the customer can input, in advance, the determinate information unique to the product to be designed when developing the product with the ASIC design support system in accordance with the present invention.

FIG. 4 is a schematic diagram showing a specific example of a batch file for use in the simulation of the ASIC design support system in accordance with the present invention.

FIG. 5 is a schematic diagram showing a specific example of the configuration file for use in the simulation of the ASIC design support system in accordance with the present invention.

DETAILED DESCRIPTION OF EMBODIMENTS

Figure 1:
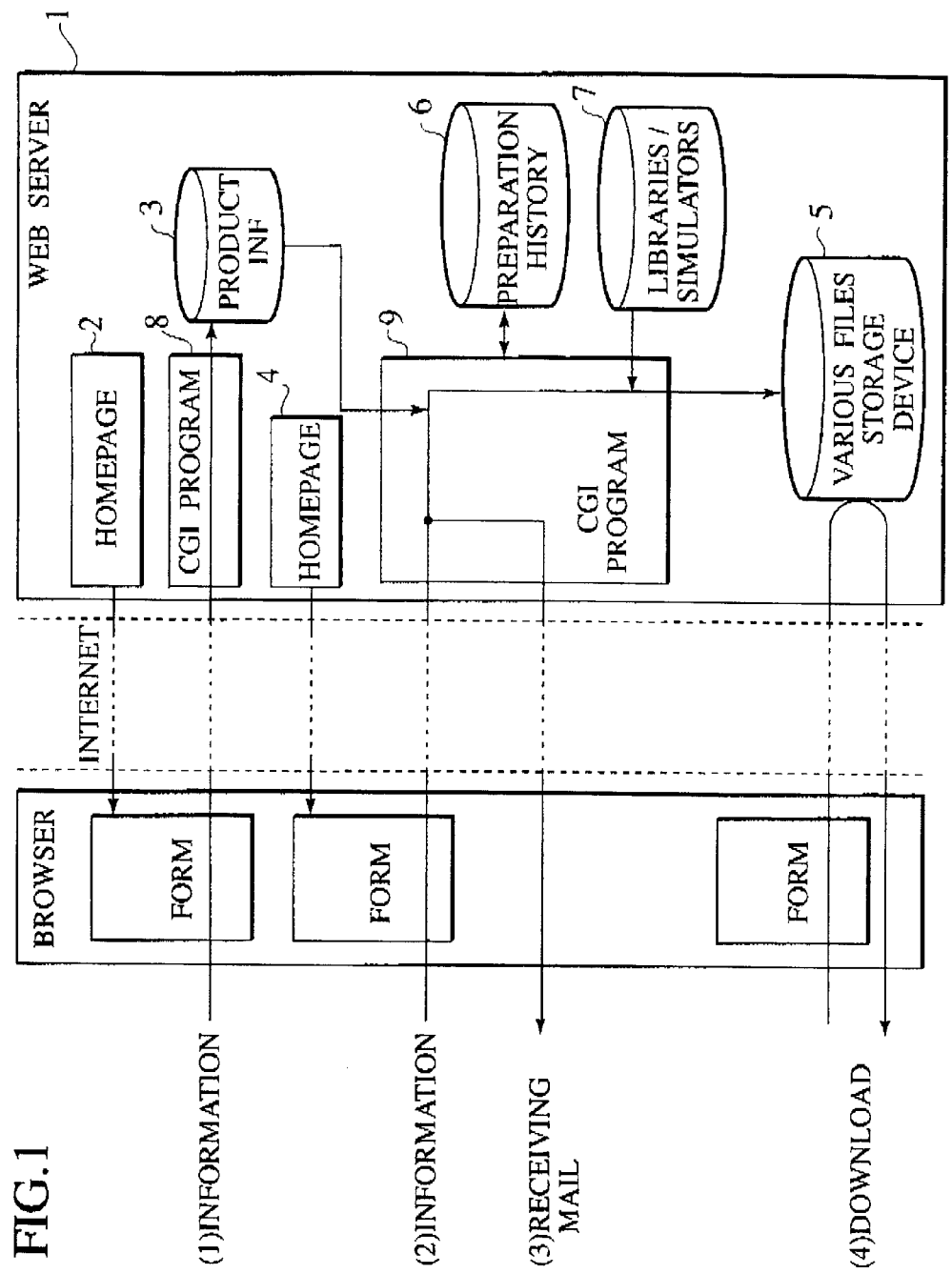
FIG. 1 is a schematic diagram for explaining the generic flow of the procedure of designing an ASIC with the ASIC design support system in accordance with the present invention.

An preferred embodiments of the present invention will be described with reference to the accompanying drawings. FIG. 1 is a schematic diagram for explaining the generic flow of the procedure of designing an ASIC with the ASIC design support system in accordance with the present invention.

First, the customer makes his terminal connected to the web server of the LSI vender through the Internet and accesses to a homepage 2 of the ASIC design support system. The homepage includes a form through which the customer can input, in advance, the determinate information unique to the product to be designed when developing the product. In accordance with the instructions in the homepage, the customer fills necessary information in the form. Also, the URL of a CGI program 8 to be executed is described in the homepage so that, when the customer clicks a "send" button, the form is transmitted to the web server of the LSI vender and the information described in the form is processed by the CGI program. The web server is implemented with the CGI program 8 and serves to transmit the result of execution of the CGI program in response to the request of the URL of the CGI program. The information described in the form is stored as product information in a database S provided in the web server of the LSI vender for each product of the LSI vender. In this case, the constant information unique to the product to be designed may include information about the customer, the purpose of the ASIC, the power voltage level, the technology to be used (may be designated by a commercial name), the simulator to be used, the package to be used, the warranty condition of reliability (operable temperature range and the like) and the like. FIG. 2 is a schematic diagram showing an exemplary page including such a form. Meanwhile, when the customer clicks the "send" button, a confirmation page is open in order to acknowledge receipt of the request.

When actually preparing the batch file and the configuration file, the customer accesses to the homepage 4 of the ASIC design support system in accordance with the present invention. The homepage includes a form through which the customer can input several conditions required for preparing the files. In accordance with the instruction information in the homepage, the customer fills out the necessary information in the form. Also, the URL of a CGI program 9 to be executed is described in the homepage so that, when the customer clicks a "send" button, the form is transmitted to the web server of the LSI vender and then the information described in the form is processed by the CGI program 9 provided in the web server. The CGI program is executed with the information given through the form in order to create the batch file and the configuration file which are then stored in a predetermined storage location 5. On the other hand, the customer is informed of the addresses (URL) of the storage location by e-mail and therefore can access to the storage location. Alternatively, instead of e-mail, the storage location 5 is automatically accessed after the customer pushes the "send" button.

Figure 3:
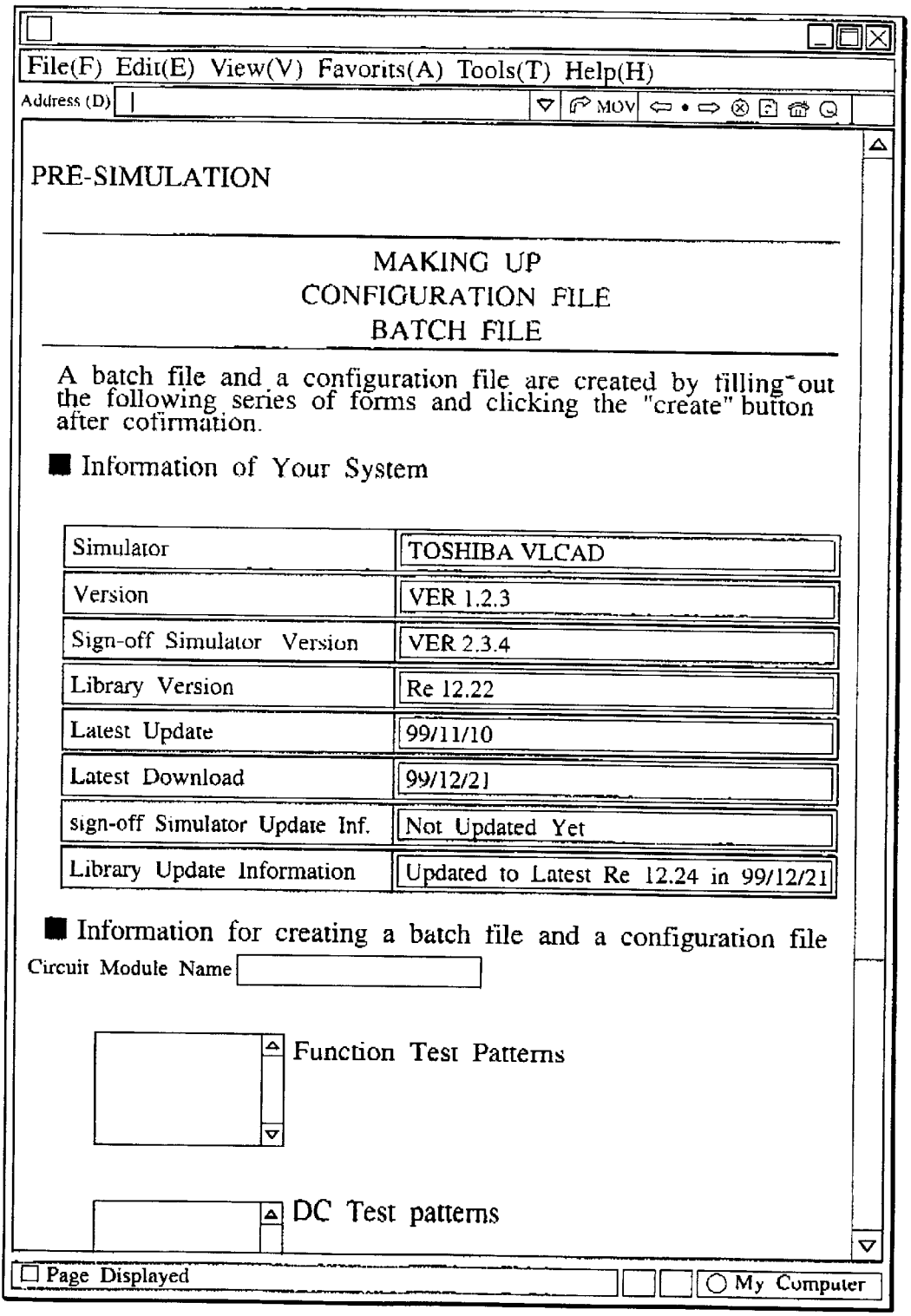
FIG. 3 is a schematic diagram showing an exemplary page including a form through which the customer can input several values required for preparing a batch file and a configuration file with the ASIC design support system in accordance with the present invention.

The preparation of the files are recorded in the database 6 storing the history of preparing files. Also, if a library (or libraries) and a simulator required for simulation have been updated in the current preparation stage from the versions as used in the previous preparation stage, the updated library (or libraries) and the updated simulator are stored in the predetermined storage location 5 at the same time. FIG. 3 is a schematic diagram showing an example of such a page. Meanwhile, after the customer clicks a "send" button, a window appears to indicate that the request is accepted.

After receiving an e-mail, the customer accesses to the addresses (URL) described in the e-mail and obtains the files from the predetermined storage location 5. Meanwhile, the processing operation, which in this case is performed by the CGI program as described above, may be performed by executing any other program of a different type than a CGI program, e.g., an SSI.

FIG. 4 is a schematic diagram showing a specific example of a batch file for use in the simulation of the ASIC design support system in accordance with the present invention. A sequence of commands of the simulator are written in the batch file as a text file in the execution order. In addition to the batch file, a configuration file indicative of the simulation conditions is required to actually perform the simulation. The configuration file is generated by the web server and provided for the customer as well as the batch file for simulation. FIG. 5 is a schematic diagram showing a specific example of the configuration file in this case.

Figure 6:
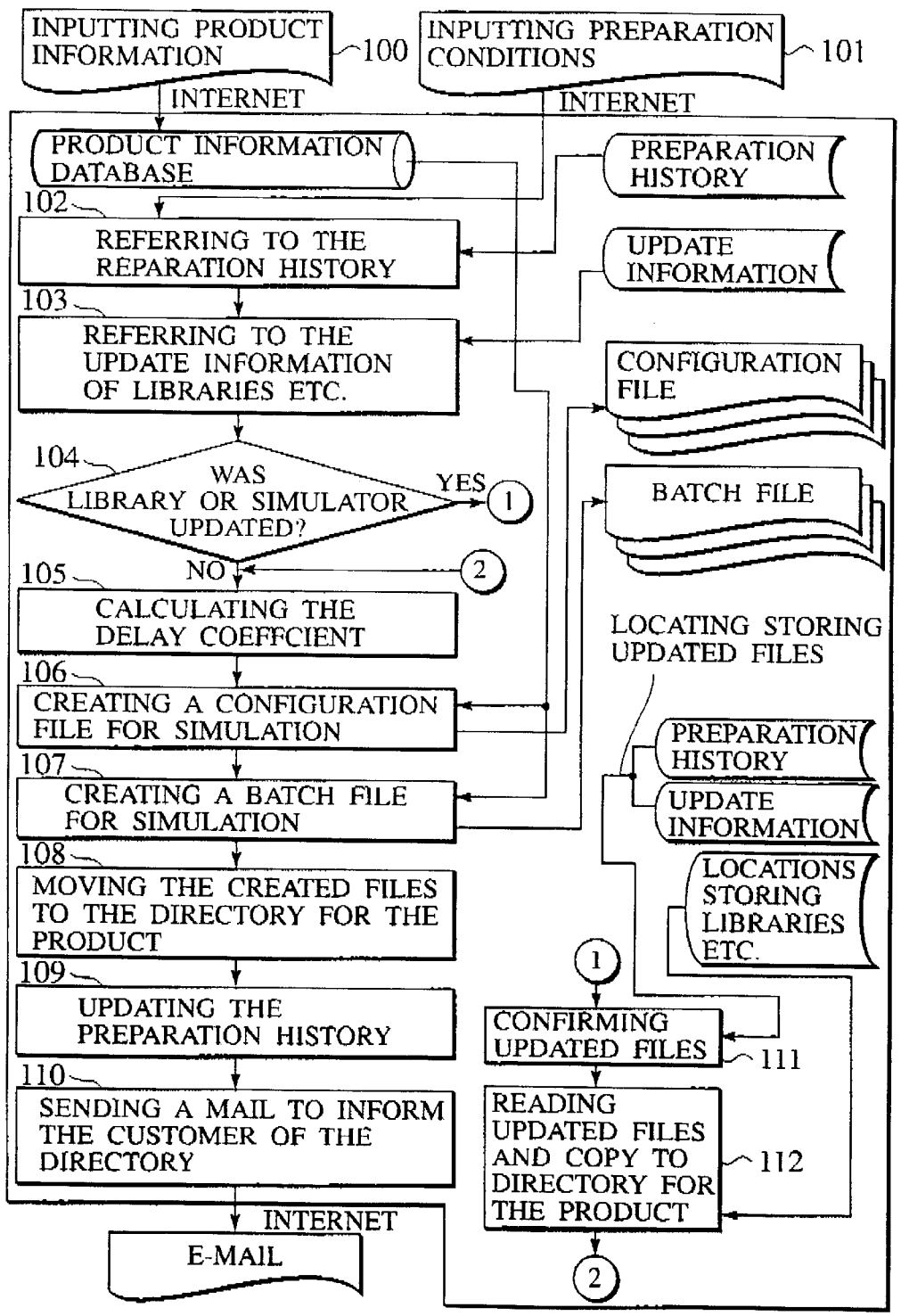
FIG. 6 is a flowchart showing steps of designing an ASIC with the ASIC design support system in accordance with the present invention.

The above procedure will be explained in details with reference to FIG. 6 in the following description. It is assumed here that the ASIC is a gate array base IC or a cell base IC.

First, in the step 100, the determinate information specific to the product, i.e., the product specification is input in accordance with the instructions in the homepage. In this case, the specification may include information about the customer, the purpose of the ASIC, the power voltage level, the technology to be used (may be designated by a commercial name), the simulator to be used, the package to be used, the warranty condition of reliability (operable temperature range and the like) and the like.

Exemplary values to be input as the specification are 5V, 3.3V or the like voltage as the power voltage, a commercial names of a CAD product (e.g, Verilog, VCS, Modelsim or the like) given by the CAD vender as the simulator to be used, a commercial name of a technology (e.g., TC200G, TC203G or the like) given by the LSI vender as the technology to be used, a name of a package given by the LSI venders as the package to be used (e.g., QFP144, BGA265 or the like), and an operable temperature range (e.g., −20° C. to +40° C. or the like) as the warranty condition of reliability and so forth.

The information as input is transferred to the web server and stored in the database as the product information which is used by the CGI program.

Next, in the step 101, the conditions of preparing the batch file and the configuration file are input to input boxes in the homepage of the LSI vender in accordance with the instructions in the homepage. The description of the preparation conditions includes the name of a circuit, the name of test data (the name of a test pattern set), the simulation method to be used and so forth. Exemplary values to be input as the description of the preparation conditions are a circuit name given by the customer as the name of a circuit, a test data name given by the customer as the name of test data, commands and requirements of performing the simulation as the simulation method to be used and so forth. The information as input is then transferred from the customer to the web server which searches the preparation history of batch files and configuration files as having prepared by the customer with reference to the database of the preparation history in the step 102. Also, in the step 103, it is confirmed whether or not the library (or libraries) or the simulator was updated after the customer obtained a batch file and a configuration file at the last time with reference to the database containing update information of the library (or libraries) and the simulator.

If the library (or libraries) and the simulator have not been updated from the versions as used in the previous preparation stage, the coefficient of delay time is calculated in the step 105. The calculation is performed by the use of the power voltage, the technology (Master), the warranty condition of reliability (operable temperature range and the like) and so forth.

A necessary file set for simulation including a configuration file and so forth is generated in the step 106. In this case, the technology, the name of a circuit, the name of a test pattern set, the product information and the like as obtained in the step 100 and the step 101 are used as well as the coefficient of delay time as obtained in the step 105.

Next, in the step 107, the batch file for simulation is generated. In this case, the batch file for simulation is generated by making use of the simulator to be used, the simulation method to be used, the name of a circuit, the name of a test pattern set and the like, and the product information as obtained in the step 100 and so forth.

Next, in the step 108, a private directory is created for each product for saving the configuration file and the batch file as generated from the information as input. If there has already been created the directory for each product, these files are moved to the directory.

Next, in the step 109, the history of preparing files is updated with respect to the batch file and the configuration file as generated followed by sending to the customer an e-mail indicative of the storage location (URL) in the step 110. The customer designates the URL described in the e-mail on the screen view of his browser in order to download the configuration file and the batch file through the Internet.

Alternatively, the batch file and the configuration file may be attached directly to an e-mail. Furthermore, it is also possible that the customer is allowed to download the batch file and the configuration file as generated through his browser after transferring the necessary information.

If it is found in the step 104 that the library (or libraries) or the simulator was updated after the customer obtained a batch file and a configuration file at the last time, the following steps are taken.

First, it is confirmed in the step 111 which file has been updated with reference to the database of the history of preparing the batch file and the configuration file and the database of updating these files. In the step 112, a private directory is created for each product followed by copying the files as updated to the private directory from the location in which the updated files are stored. Next, after the step 112, the process is continued from the step 105.

In usual cases, the library (or libraries) and the simulator as updated as described above are transmitted at the same time as the configuration file and the batch file. However, rather than all the file, only some of these files may be transmitted by designation through the browser. Anyway, the customer designates the URL described in the e-nail is designated on the screen view of his browser in order to download the library (or libraries) and the simulator through the Internet. Alternatively, the library (or libraries) and the simulator as updated may be attached directly to an e-mail. Furthermore, it is also possible that the customer is allowed to download the library (or libraries) and the simulator as updated through his browser after transferring the necessary information.

After obtaining the library (or libraries) and the simulator as updated together with the necessary configuration file and the necessary batch file, the customer can perform simulation with reference to other necessary information which is obtained by downloading through the Internet in the same manner. Generally speaking, the simulation is performed in two steps As a first step simulation, a virtual wiring length simulation is performed. The virtual wiring lengths simulation is a prelayout simulation which is performed using statistically estimated wire loads in advance of physical layout. Namely, timing and logic tests are performed with the virtual interconnections by this simulation. After the prelayout simulation, final delay values are calculated based on the actual wire length data derived from physical layout, and the design is reverified through simulation. For each simulation, the steps advances apace as described above.

In the case of the above described embodiment, the storage location (URL) of the configuration file and the batch file are provided for the customer by sending an e-mail indicative of the storage location (URL) in which these files are stored. This is particularly convenient because each member of the development group of the customer can download a necessary file(s) from the storage location (URL) respectively. However, needless to say, the configuration file and the batch file themselves can be attached to an e-mail rather than the storage location (URL). Alternatively, it is also possible that the customer is allowed to download the library (or libraries) and the simulator as updated through his browser after transferring the necessary information.

In accordance with the present invention, it is possible to easily generate the batch file and the configuration file in a short time without error.

Furthermore, if it is found with reference to the history of preparing files that the library (or libraries) and the simulator have been updated from the versions as previously used, the latest versions of these files can be downloaded from the homepage of the LSI vender at the same time as the configuration file and the batch file are generated, and therefore it is possible to lessen the circuit development time.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. An ASIC design support system comprising:

a web server;

a homepage stored in said web server and transmitted to a customer through the Internet, said homepage containing a form through which said customer can transmit to said web server the specification of an ASIC which said customer wants to purchase;

a file generation mechanism associated with said web server for receiving the specification of said ASIC and generating a batch file and a configuration file which are required for designing said ASIC and performing simulation thereof;

a mechanism for transferring said batch file and said configuration file required for designing said ASIC and performing simulation thereof;

an update judgment mechanism for judging whether or not a library and/or a simulator required for designing said ASIC and performing simulation thereof was updated after said customer obtained a batch file and a configuration file at the last time with reference to update information of the library and the simulator and historic information of preparing batch files and configuration files; and a mechanism for transferring the latest versions of said library and/or said simulator required for designing said ASIC and performing simulation thereof when said update judgment mechanism judges that said library and/or said simulator required for designing said ASIC and performing simulation thereof was updated after said customer obtained a batch file and a configuration file at the last time, wherein the batch file and the configuration file as generated by said file generation mechanism are downloaded directly from the homepage.

* * * * *